United States Patent [19]

Stokes et al.

[11] Patent Number: 4,565,995

[45] Date of Patent: Jan. 21, 1986

[54] ANTI-ENERGY DIVERSION SYSTEM FOR ELECTRIC UTILITY METERS

[75] Inventors: John H. Stokes; John I. Clark, both of Las Cruces; Charles E. Maxwell, Albuquerque, all of N. Mex.

[73] Assignee: Energy Optics, Inc., Las Cruces, N. Mex.

[21] Appl. No.: 524,897

[22] Filed: Aug. 22, 1983

[51] Int. Cl.[4] ............................................. G08B 13/14
[52] U.S. Cl. ..................................... 340/571; 340/541
[58] Field of Search ............... 340/571, 637, 691, 541, 340/572, 870.02, 524, 525; 116/207, 4; 324/110; 431/13, 17, 360

[56] References Cited

U.S. PATENT DOCUMENTS 3,634,846  1/1972  Fogiel ................................. 340/521
3,714,647  1/1973  Litman ............................... 340/531
3,786,502  1/1974  Stendig et al. ..................... 340/545
4,117,468  9/1978  Vásquez ............................. 340/571

Primary Examiner—Charles A. Ruehl
Assistant Examiner—Chi K. Lau

[57] ABSTRACT

An anti-energy diversion system for mounting underneath the cover of a standard electric utility meter in order to sense common meter tampering events and indicate the occurrence of such events. A non-battery energy storage circuit extracts energy from the AC power line available in the meter to power the system even during power outages. A flashbulb associated with a heat sensitive indelible indicator is coupled to the energy storage circuit when any one of several tamper event sensor switches are closed. When a tamper event is sensed, a brilliant flash of light is discharged and the appearance of the indelible indicator is transformed.

9 Claims, 5 Drawing Figures

ANTI-ENERGY DIVERSION SYSTEM FOR ELECTRIC UTILITY METERS

BACKGROUND OF THE INVENTION

1. Field of the Invention

The invention relates generally to a device which is mounted inside the cover of standard electric utility meters for the purpose of preventing energy diversion by means of meter tampering. When a meter tamper event is sensed, the device discharges a brilliant flash of light and changes the appearance of a larger indelible indicator, informing both the would-be tamperer and the meter reader that an attempt has been made to divert energy.

Spiraling electricity costs have encouraged many otherwise honest consumers to attempt to divert energy by means of altering utility meter readings. It is estimated by several studies that energy diversion in the United States costs the electric utility industry in excess of one billion dollars annually in unaccountable losses. Such studies estimate that the average cost borne by each consumer amounts to between $20 and $40 per annum. Since the vast majority of energy diversion goes undetected, the actual magnitude of the problem is unknown.

Most electric utility meters in the United States are protected from meter tampering by small wire seals which are easily broken, reconfigured, counterfeited and/or replaced. Broken and reconfigured seals can be difficult if not impossible to detect in the course of normal meter reading procedures. More costly locked ring adapters which lock the meter to its receptacle provide a greater degree of protection, but the tools required for opening such devices are easily obtainable. Locked metal housings completely enclosing the meter which are used on many industrial consumers provide increased security, but are considered impractical in broadscale, residential applications.

2. DESCRIPTION OF PRIOR ART

Security systems have been the subject of many past inventions. There are numerous prior art devices which intended to prevent the theft of physical objects by triggering indicators or alarms when a suspicious event is sensed. One such alarm actuating device is found in U.S. Pat. No. 3,742,480. This device utilizes the breakage of a retainer wire wrapped around the hardware to be protected to trigger an audible and visible alarm circuit intended to attract immediate attention to the theft. The alarm circuit comprises a thermostatic lamp in combination with a battery operated electronic circuit to intermittently activate the lamp and an accompanying audible alarm. Other devices found in U.S. Pat. No. 3,289,194 and U.S. Pat. No. 3,423,747 are specifically intended to sound an audible alarm on the theft of household appliances by sensing the unauthorized act of unplugging the power cable from the wall outlet. These battery powered systems are designed to avoid false triggering in electrical power outages. In addition, a large number of electro-mechanical switch devices such as those found in U.S. Pat. Nos. 3,781,857; 4,365,240; 4,150,371; 4,047,167; 4,300,130 and 4,316,181 are intended to detect the removal or change in orientation of the protected equipment in order to trigger some associated security alarm system.

Although many such security systems are well known in prior art, it can be easily seen that securing against the unauthorized or unmetered flow of electricity is a generically different problem than securing a building or specific piece or equipment. For example, it is not only feasible but quite easy for a residential consumer to steal large amounts of electricity without ever removing the electric utility meter from its socket. If the meter is removed, it can easily be replaced by jumpers or modified to operate in reverse or at slower rates of registration. The problem is compounded by the fact that utility meters are located at long distances from the utility company and without substantial expense can not be monitored by central alarm systems. In addition, the large number of utility meters in a system requires the per meter expense of an effective energy diversion monitoring system to be quite low.

Serious disadvantages and shortcomings of prior art security devices prevent their direct adaptation to electric meter energy diversion. The vast majority of security devices would be too costly for broadscale application on residential electric meters. For example, most stand alone, electronic security systems require a battery power source for back up operation in power outages. However, batteries which operate in the extreme temperatures experienced inside an electric meter are quite expensive, and the expense associated with installation and replacement is prohibitive. In addition, many security systems seen in prior art such as that of U.S. Pat. No. 3,742,480 utilize continuous or intermittent audible and/or visible alarms to draw immediate attention to the theft. Although such techniques may be effective, they are impractical for energy diversion since the meter site is visited only once a month and any false alarms could cause severe problems.

While it would appear that the art disclosed in U.S. Pat. Nos. 3,289,194 and 3,423,747 would be adaptable to preventing the unauthorized unplugging of electric meters, similar shortcomings preclude their application in preventing energy diversion. First, the sensing method of detecting electrical disconnection alone is not adequate to detect the broad range of common meter tampering techniques. Second, the activation of local, continuous alarms serves no practical purpose. Finally, the required battery power source poses installation, maintenance and unit cost problems.

Although the multitude of security sensor switches of prior art may be adaptable to sense meter tamper events, any one of these switches alone would be insufficient to detect the wide range of common tampering methods. For example, the electro-mechanical switch and tamper indicator disclosed in U.S. Pat. No. 4,150,371 which is designed to sense the removal of a gas or water meter encoder device, could be adapted to sense the removal of an electric meter from its socket. However, such adaptation would require the modification of the meter and would not be effective in sensing meter tampering methods which do not require meter removal. Further, the tamper indicator disclosed provides only a very subtle indication which might be noticed by the meter reader but would not be obvious to the would-be thief. In such a case, the thief would proceed to divert energy at will.

SUMMARY OF THE INVENTION

It is, therefore, the primary object of the present invention to provide an anti-theft system for the prevention of energy diversion in electric utility meters which overcomes the disadvantages and shortcomings of prior art security systems and which is very significantly cost advantageous.

It is a more specific object of the present invention to provide an anti-theft system which, on sensing meter tamper activity, discharges a brilliant flash of light and transforms the appearance of a large indelible indicator, thereby discouraging a would-be thief from stealing any significant amount of energy.

It is a further object of the present invention to provide an anti-energy diversion system which is very low in unit cost and can be installed on a wide range of electric utility meters without any requirement for meter modification.

It is a still further object of the invention to provide an anti-energy diversion system wherein all its components are mounted within the confines of a standard electric utility meter cover, so that the system cannot be accessed without triggering the indicator.

It is a still further object of the invention to provide a clear encapsulated housing for the indelible indicator so that, once triggered, it cannot readily be retouched or disguised in any way.

It is a still further object of the invention to provide an energy storage alarm circuit which requires a substantial delay period on initial charging providing immunity from false triggering when the system is installed in the meter.

It is a still further object of the invention to provide an energy storage alarm circuit which operates properly even in long term power outages without any requirement for batteries.

It is a still further object of this invention to provide a multiple sensor switch arrangement to allow the detection of a broad range of meter tampering methods.

According to the present invention, the foregoing and other objects are attained by providing an electronic energy storage circuit which is initially charged from the AC power line available in electric utility meters. Sufficient energy is stored and maintained (even in power outages) without the use of batteries to discharge a common camera flashbulb when any one of several sensor switches are closed on detection of meter tampering activity. The burning filament of the bulb generates sufficient thermal energy to transform the appearance of a large heat sensitive indelible indicator which is imbedded inside a clear encapsulated housing. The indicator is easily seen by both the would-be energy thief and the meter reader in the course of his normal duties.

The responsive action of the anti-energy diversion system of the present invention is intended to have two important effects on the would-be energy thief. First, the intense flash of light although harmless has a startling effect on someone who is tampering with the meter. The would-be thief may assume that the device has generated some fool-proof evidence regarding the tamper activity or his identity. In any case, the brilliant flash of light is intended to make the meter tamperer stop and reconsider his actions. Second, the indelible indicator which cannot readily be retouched or disguised informs the tamperer that upon the next meter reading, the utility company will be aware that tamper activity had occurred. It is intended that the tamperer would then realize that his energy consumption patterns would fall under close scrutiny by the central billing computer and that it would be foolhardy to steal any significant amount of energy,. Regardless of any effects on the meter tamperer, the present invention provides the utility company with reliable information locating energy diversion problem areas for further investigation. The present invention is directed toward overcoming technical limitations of prior art security devices by providing a highly reliable yet low cost means for detecting electric utility meter tampering before an actual energy theft has occurred and for discouraging a would-be energy thief.

For a better understanding of the present invention, together with other and further objects thereof, reference is had to the following description taken in connection with the accompanying drawings, and its scope will be pointed out in the appended claims.

DETAILED DESCRIPTION OF THE INVENTION

Figure 1A:
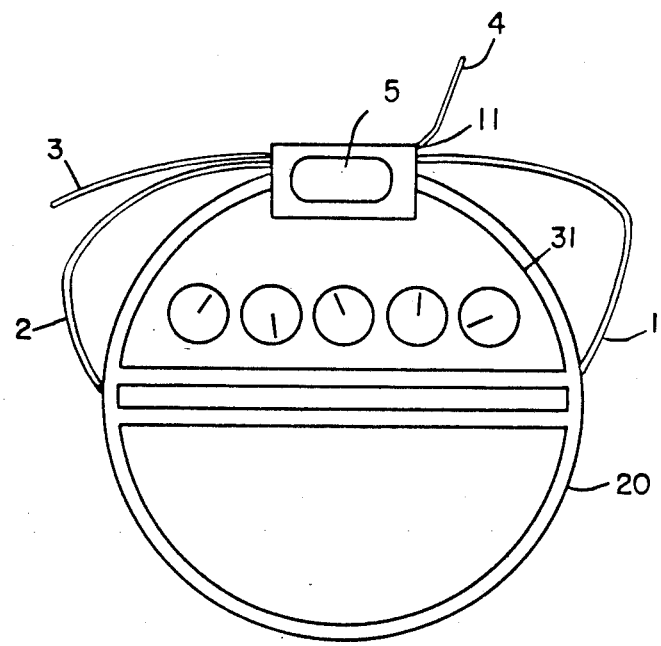
FIG. 1a is a perspective view of an electric meter with the anti-energy diversion module installed, before the indelible indicator has been transformed.
Figure 1B:
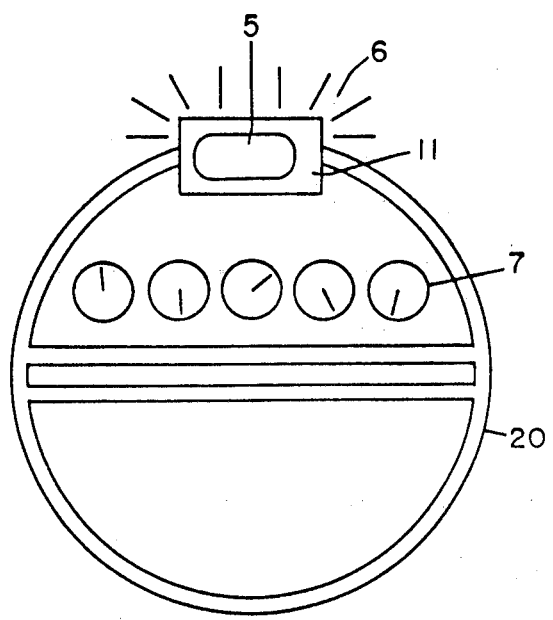
FIG. 1b is a perspective view of an electric meter with the anti-energy diversion module installed, after the indelible indicator has been transformed.

Referring now to FIG. 1a, the anti-energy diversion system of the present invention, hereinafter referred to as AED system 10 (see FIG. 2a ) comprises a clear plastic module 11 which attaches to the register plate 31 of a standard electric meter 20. The two power lead cables 1, 2, of the system 10 are electrically coupled to the power line leads (not shown) available in the meter 20. Two other lead cables 3, 4 from the system 10 are available for connecting any user specified sensor switches not shown. An indelible indicator 5 imbedded within the clear plastic structure 11 of the system 10 is easily seen from the front of the meter 20. As seen in FIG. 1b, when tamper activity is sensed by the AED module 10, the system generates a brilliant flash of light 6 and transforms the appearance of indicator 5 in such a manner that it will be easily noticed by a meter reader (not shown) in the normal course of reading the meter dials 7.

Figure 2A:
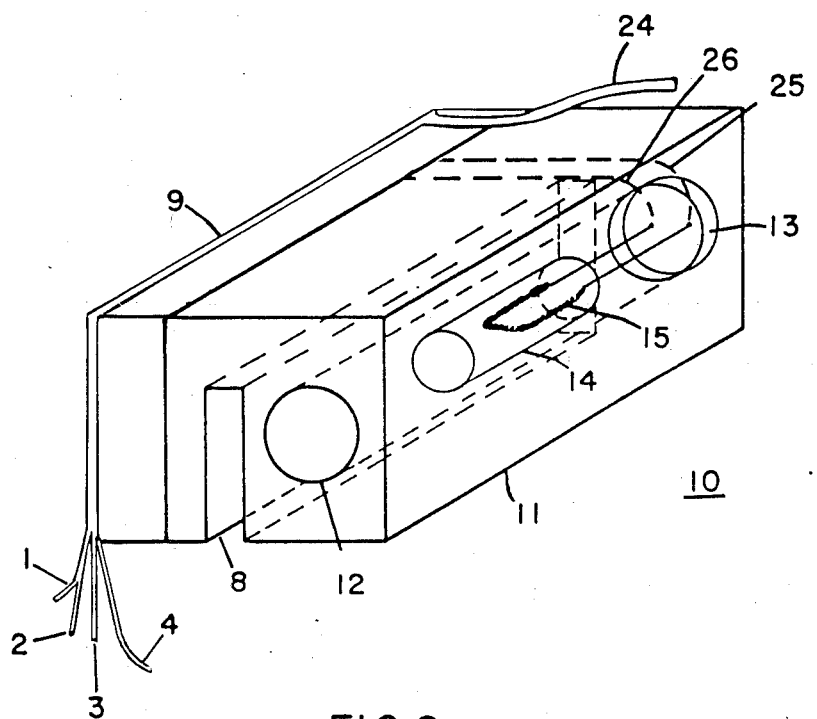
FIG. 2a is a perspective view of the mounting board and circuit components of the anti-energy diversion module.

An expanded view of the AED module 10 is seen in FIG. 2a. The module 10 is configured with a mounting slot 8 which allows the module 10 to be easily mounted on the electric meter register plate 31 seen in FIG. 1a. The module 10 includes an encapsulated electronic circuit board 9, a clear plastic housing 11 and a cylindrical receptacle 12 with a connector 13 for a standard camera flashbulb 14. After the flashbulb 14 is inserted into the connector 13 thereby electronically connected to the circuit board 9, a clear potting compound (not shown) can be applied to the cylindrical cavity 12 so that the bulb 14 cannot be removed. Such a configuration offers the greatest immunity to module reconfiguration by a would-be thief after meter tampering. Optionally, however, the module 10 can be utilized without the potting compound (not shown), so that the module 10 can be reused. In the preferred embodiment, the indelible indicator 5 seen in FIG. 1a is comprised of a transluscent coating (not shown) on the flashbulb 14. When the magnesium filament 15 of the bulb 14 burns, the intense heat radiating through the coating (not shown) causes the appearance of the bulb 14 to transform from a pale white to a bright orange (for example).

Figure 2B:
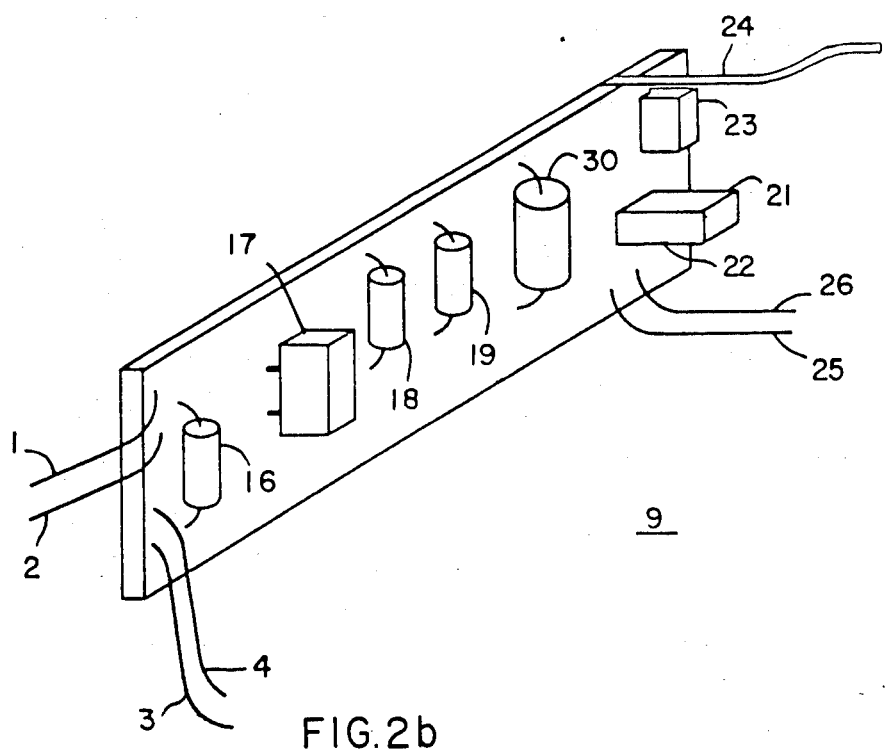
FIG. 2b is a perspective view of the anti-energy diversion module.

Referring now to FIG. 2b, a perspective view of the component mounting board 9 of the AED module 10 is shown. The board 9 is a printed circuit board which both houses and electronically connects the components of the module 10. AC line power is coupled to the board 9 by means of lead cables 1 and 2. The flashbulb connector 13 is connected to the board by means of lead cables 25 and 26. User specified sensor switches (not shown) are connected to the board by means of lead cables 3 and 4. The electronic components 16, 17, 18, 19 and 30 are arranged on the board in a fashion to effect proper wiring of the AED circuitry. Two standard meter tamper sensor switches 21, 23 are also mouned on the board 9. A normally closed microswitch 23 is arranged so that when the module 10 is mounted on the meter 20, and the meter cover is replaced, the cover (not shown) will depress the lever arm 24 and open the switch 23. In this manner, if a would-be thief attempts to remove the meter cover (not shown), the sensor switch 23 will close. A second sensor switch 21 is a memory 22 switch which closes when the orientation of the meter 20 is drastically changed. When one attempts to pull the meter 20 from its standard mounting socket (not shown), the mercury 22 moves to effect the closure of two contacts (not shown) within the switch 21. In either case, the closure of any sensor switch triggers the discharge of the flashbulb 14 seen in FIG. 2a.

Figure 3:
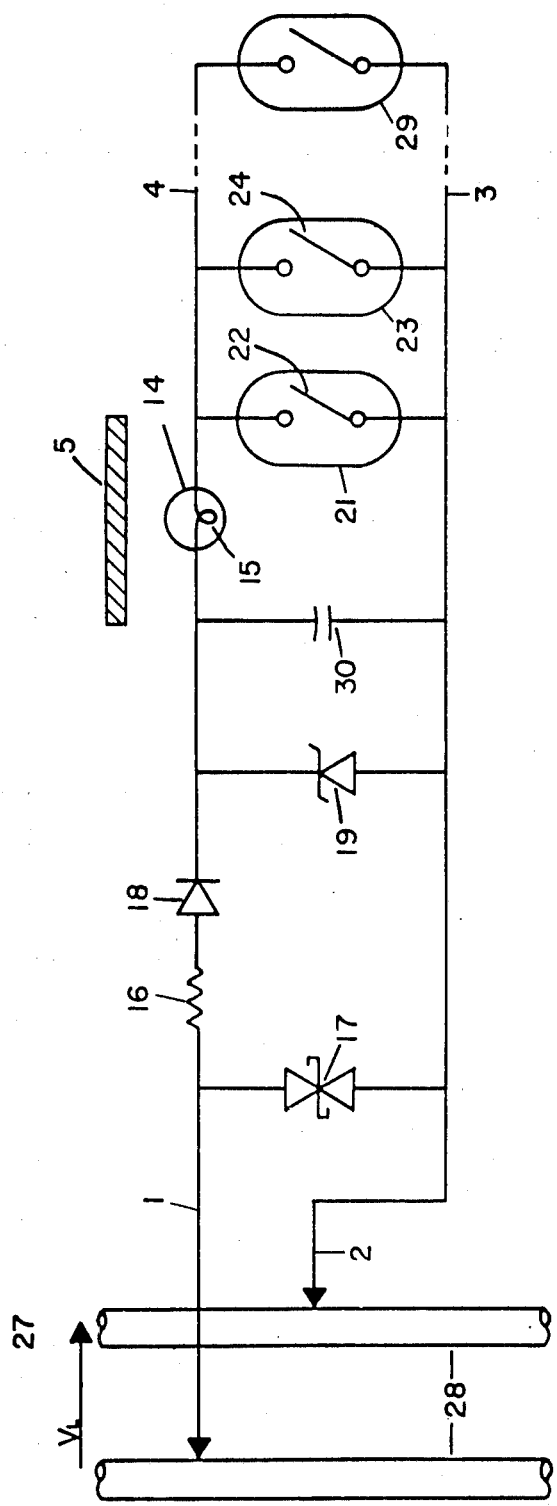
FIG. 3 is a schematic representation of the electronic circuitry associated with the anti-energy diversion system.

A schematic diagram of the AED module 10 electronic circuitry is seen in FIG. 3. The circuitry derives its power from the line potential VI 27 available in the electric meter 20. Line power 27 is typically 240 VAC at 60 Hz. A very small amount of energy is required from the line 28 in order to charge a capacitor 30 and maintain its charge in the preferred embodiment. A metal oxide varistor 17 is coupled across line 28 in order to limit the magnitude of either positive or negative going voltage transients which are commonly seen on power lines. This component 17 then protects the other components 16, 18, 19, 30 from degradation or destruction due to common line transients. Series resistor 16 provides two functions. First it limits the current that can be drawn from the line, protecting the circuit from current surges. In addition, the value of the resistance 16 in combination with the value of the capacitance 30 controls the charging time of capacitor 30. Typical values of 330K OHM for the resistor 16 and 100 microfarads for capacitor 30 result in a charge time constant of 33 seconds. Diode 18 acts as a half wave rectifier yielding a positive half-sine waveform across the parallel combination of the zener diode 19 and the capacitor 30. The zener diode 19 limits the positive potential to a magnitude which is well within the maximum voltage specification for capacitor 30.

In a typical field installation, the AED module 10 would be attached to an electric meter 20 which is out of its meter socket (not shown), and the meter cover (not shown) would be replaced. When the meter 20 is plugged into its standard receptacle (not shown), line potential 27 begins charging energy storage capacitor 30. Since the capacitor must be charged in order to supply sufficient current to ignite the flashbulb 14, the charging delay prevents tamper sensor switches 21 or 23 from false triggering the module 10. Approximately 33 seconds after the meter 20 is installed, the AED module 10 is automatically armed and ready to ignite flashbulb 14, whenever a tamper event is detected.

Studies conducted by one electric utility company indicate that 98% of all energy diversion occurrences associated with the electric meter 20 require that either the cover (not shown) be removed or that the meter 20 be pulled from its socket (not shown). Therefore, the standard sensor switches 21, 23 seen in FIG. 3 are configured to close on either cover removal or meter removal. The AED module 10 provides external leads 3, 4 so that the user can connect any desired sensor switch 29 for the detection of additional energy diversion activities. As can easily be seen in the schematic, if any sensor switch 21, 23, 29 closes, a circuit path is completed which allows the flashbulb 14 filament 15 to be short circuited directly accross the energy storage capacitor 30. The flashbulb 14 then draws an excessive amount of current from the capacitor 30 until the magnesium filament 15 heats up and burns. The burning filament 15 radiates intense heat which then transforms the appearance of the heat sensitive indelible indicator 5 as previously described. The indicator 5 of the preferred embodiment is comprised of any one of several chemical compounds well known in the art that transform in color when exposed to intense heat. The chemical compound of indicator 5 is applied as a coating directly on the surface of flashbulb 14.

The energy storage capacitor 30 of the AED module 10 is of the low leakage type with current leakage in the microampere range. Therefore, once capacitor 30 is charged, very little energy from the line potential 27 is required to maintain that charge. In addition, during long term power outages, such a capacitor 30 maintains sufficient energy to discharge the flashbulb 14 without any need for backup batteries. When the line power is restored, capacitor 30 is recharged to its maximum capacity. In this manner, the AED module 10 properly functions even if the energy diversion is detected in the midst of long term power outage.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of this invention.

What is claimed is:

1. An anti-energy diversion system for use with an electric utility meter connected to an AC power line for discouraging energy theft by providing a positive indication of meter tampering, comprising in combination:

non-battery energy storage means for extracting and storing electrical energy from the AC power line of the meter for providing an initial charging delay and backup operation in power outages;

light discharging means effective to convert the stored energy to light and heat when meter tampering is detected;

heat sensitive indicator means responsive to said heat in a manner effective to generate a highly contrasting change in appearance when exposed to said heat;

multiple switch means electrically connected to said storage means and connectable to said discharging means, and effective to close the circuit path between said storage and discharging means when any one of several energy diversion events are sensed, thereby delivering said stored energy to said light discharging means.

2. A system according to claim 1, wherein said energy storage means is a resistor/capacitor circuit with sufficient charging delay to prevent false triggering during meter installation.

3. A system according to claim 2, wherein said capacitor has sufficiently high capacitance and low leakage to discharge a common camera flashbulb even after several hours of power line outage when said flashbulb is connected directly accross said capacitor.

4. A system according to claim 1, wherein said light discharging means comprises a standard, magnesium filament camera flashbulb encapsulated in a clear plastic housing.

5. A system according to claim 4, wherein said flashbulb is replaceable.

6. A system according to claim 1, wherein said indelible indicator comprises a chemical compound which changes its color when exposed to intense heat which is coated on the surface of said light discharging means.

7. A system according to claim 1, wherein said multiple switch means includes a mercury switch sensing changes in orientation.

8. A system according to claim 1, wherein said multiple switch means include a microswitch sensing the presence of the cover of said electric utility meter.

9. A system according to claim 1, wherein said multiple switch means include two wire leads allowing the electrical connection of any number of user specified sensor switches.

* * * * *